(12) United States Patent
Ichino et al.

(10) Patent No.: US 8,186,300 B2
(45) Date of Patent: May 29, 2012

(54) PLASMA PROCESSING APPARATUS

(75) Inventors: Takamasa Ichino, Kudamatsu (JP);
Ryoji Nishio, Kudamatsu (JP);
Tomoyuki Tamura, Kudamatsu (JP);
Shinji Obama, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 524 days.

(21) Appl. No.: 12/370,215

(22) Filed: Feb. 12, 2009

(65) Prior Publication Data
US 2010/0163184 A1 Jul. 1, 2010

(30) Foreign Application Priority Data

Dec. 26, 2008 (JP) ................................. 2008-331821

(51) Int. Cl.
C23F 1/00 (2006.01)
H01L 21/306 (2006.01)
C23C 16/00 (2006.01)
B05C 11/00 (2006.01)
H01J 7/24 (2006.01)
H05B 31/26 (2006.01)

(52) U.S. Cl. ..... 118/663; 118/715; 118/722; 118/723 E; 118/723 R; 156/345.28; 156/345.43; 156/345.44; 156/345.45; 156/345.46; 156/345.47; 315/111.21

(58) Field of Classification Search ............. 156/345.28, 156/345.43, 345.44, 345.45, 345.46, 345.47; 118/715, 722, 723 E, 723 R, 663; 315/111.21
See application file for complete search history.

(56) References Cited

U.S. PATENT DOCUMENTS

| 6,265,831 | B1 * | 7/2001 | Howald et al. ........... 315/111.21 |
| 6,426,477 | B1 * | 7/2002 | Koshimizu et al. ...... 219/121.41 |
| 7,402,527 | B2 * | 7/2008 | Yamashita et al. ............. 438/706 |
| 7,780,864 | B2 * | 8/2010 | Paterson et al. .................. 216/59 |
| 2003/0132195 | A1 * | 7/2003 | Edamura et al. ................. 216/59 |
| 2006/0278608 | A1 * | 12/2006 | Hoffman ......................... 216/61 |
| 2008/0179005 | A1 * | 7/2008 | Sagae et al. ............. 156/345.28 |

FOREIGN PATENT DOCUMENTS

JP 2001-156051 6/2001

* cited by examiner

*Primary Examiner* — Dah-Wei Yuan
*Assistant Examiner* — Binu Thomas
(74) *Attorney, Agent, or Firm* — McDermott Will & Emery LLP

(57) ABSTRACT

A plasma processing apparatus for processing a surface of a to-be-processed substrate includes a processing chamber, a first electrode provided in the processing chamber, a second electrode arranged in opposition to the first electrode, a main power source for supplying the first or second electrode with power for generating a plasma, a biasing power source for supplying the second or first electrode with biasing power, a gas supplying unit for supplying a processing gas into the processing chamber and a control unit for controlling the main power source, the biasing power source and the gas supplying unit. The control unit performs a control such that, during a time of transition from a stationary state of plasma, in which a plasma processing is to be carried out, to a plasma quenching, an output of the main power source is kept not larger than an output of the biasing power source.

5 Claims, 9 Drawing Sheets

PLASMA PROCESSING APPARATUS

BACKGROUND OF THE INVENTION

The present invention relates to plasma processing apparatus and methods employed for fine-patterning to-be-processed substrates such as wafers in a semiconductor manufacturing process. More particularly, the invention relates to plasma processing apparatus and methods much less susceptible to the charge-up damages.

The plasma processing techniques involving the plasma etching technique and the plasma CVD technique are widely used in the apparatus for manufacturing semiconductor devices.

FIG. 1 shows a structure of a typical plasma etching apparatus of the related art employed in plasma-etching an insulating film.

The plasma etching apparatus shown in FIG. 1 is in a so-called two-frequency capacitively coupled type structure. The processing chamber 101 includes therein a lower electrode 102 for placing thereon a substrate to be processed and an upper electrode 103 in opposition to the lower electrode 102. An etching gas such as Ar gas, fluorocarbon gas, or $O_2$ gas is supplied into the chamber 101. A high frequency power source 104 supplies high frequency power at 200 MHz to the upper electrode 103 through a matching box 105 for generation of a plasma P. Hereafter, the high frequency power source for powering the upper electrode is referred to as "a main power source".

Meanwhile, the lower electrode 102 is, as a bias, supplied with high frequency power at 4 MHz from another high frequency power source 106 through another matching box 107. Hereafter, the high frequency power source for powering the lower electrode is referred to as "a biasing power source". As the biasing power source is coupled via a stopping capacitor in the matching box 107 to the lower electrode, a self bias potential (Vdc), which is at a DC negative voltage, is applied to the to-be-processed substrate W. The distance between the lower electrode 102 and upper electrode 103 will be referred to as "the gap". Recently, in the process of manufacturing semiconductor devices for which finer patterns are always promoted, etching of an insulating film is achieved with a process called a narrow gap process in which the above-mentioned gap is narrow. Typically, the gap is as narrow as 18 mm to 30 mm or so.

When an insulating film formed on a to-be-processed substrate W is plasma-etched for patterning with the related art plasma etching apparatus, a problem arises such that, some devices in the substrate may be damaged during the plasma etching to lower the production yield, particularly so when the gap is narrow. This phenomenon is called the charge-up damage. In this specification, it will be merely referred to as "the damage".

FIG. 2 shows a structure of a device called "the antenna MOS capacitor type damage TEG (Test Element Group)", which serves to determine damages.

The device has a gate oxide film and a gate electrode formed on a Si substrate in the described order, the Si substrate being a to-be-processed substrate. When the potential difference between the gate electrode and the Si substrate exceeds a blocking voltage of the gate oxide film, electric current will flow through the gate oxide film to cause a dielectric breakdown. Whether the dielectric breakdown is reached or not may be known from a corresponding change in the current-voltage characteristics of the device. Thus, by providing such a device in a surface of a to-be-processed substrate, it will be possible to detect locations of damages having occurred.

When a semiconductor device to be subjected to the plasma etching treatment includes a structure similar to that of the antenna MOS capacitor type damage TEG, occurrence of a dielectric breakdown to damage the semiconductor device will lead to a lowering of the production yield. Such damage is caused by a potential difference between the gate electrode and the Si substrate, the potential difference being considered to be brought about by a non-uniformity of the in-plane distribution of the Vdc applied to the to-be-processed substrate.

The potential of the Si substrate is determined by a mean value of Vdc applied to the whole Si substrate, while the potential of the gate electrode is determined by Vdc applied to the gate electrode. Therefore, when the in-plane distribution of Vdc is not uniform, a difference is apt to occur between Vdc applied to the gate electrode and the potential of the Si substrate so that damages are liable to take place.

On the contrary, when the in-plane distribution of Vdc is uniform, damages are not liable to take place. Various measures have heretofore been studied and investigated for suppressing the damages, and JP-A-2001-156051 corresponding to U.S. Pat. No. 6,426,477, for example, discloses a process in which, at the time of igniting/quenching a plasma, a biasing power source is rendered to have some output with a sheath existing, thereby effecting the plasma ignition/quenching.

SUMMARY OF THE INVENTION

However, it has been found that, even when the biasing power source provides some power at the time of the plasma ignition/quenching, damages may be caused. Further, since the output of the biasing power source is kept at the same level as in the stationary state until just before a plasma quenching, the absolute value of Vdc is so large that damages tend to occur when the plasma is quenched in a non-uniform manner to cause high Vdc applied to some places.

The present invention is based on experimental researches on the damages for the purpose of realizing a plasma processing free of damages. In consideration of the above-described mechanism of generation of damages, a distribution of Vdc applied to a to-be-processed substrate should be determined to measure damages.

FIGS. 3A and 3B show, in plan and in section, respectively, a damage voltage measuring substrate which has an insulating film formed on a to-be-processed substrate and antenna electrodes of aluminum formed on the insulating film.

This measuring substrate has antenna electrodes distributed in a plane generally parallel with the surface of the to-be-processed substrate so that the measuring substrate is capable of determining an in-plane distribution of Vdc. It is considered that voltages of differences between antenna electrode potentials and a wafer substrate (Si substrate) potential are applied to the insulating films with a result that damages are caused at locations where the difference voltages are high. A difference between an antenna electrode potential and the wafer substrate potential will be hereafter referred to as "a damage voltage".

Damage voltages were actually measured at various points. The locations of places in the antenna MOS capacitor type damage TEG where breakdown has occurred were coincident with those of the points at which the measured damage voltages were high. As a result of the experiments, it has been found that it is at the plasma quenching that the damage voltages become the highest.

In the plasma quenching method according to the related art, the main power source and the biasing power source are simultaneously rendered null for quenching a plasma. However, it has been found that, with this plasma quenching method, the damage voltage may become high in the course of the lowering of the outputs of the main power source and the biasing power source. Thus, in order to suppress the damages, a novel plasma quenching technique with which the damage voltage is lower will be necessary.

It is an object of the present invention to provide a novel and useful plasma processing apparatus in which damage voltages are suppressed.

It is another object of the present invention to provide a novel and useful plasma quenching method in which damage voltages are suppressed.

Another object of the present invention is to provide a plasma processing apparatus in which the rate of breakage of devices in a to-be-processed substrate during a processing of the to-be-processed substrate is lowered to thereby prevent occurrence of damages.

According to an aspect of the present invention, a plasma processing apparatus for processing a surface of a to-be-processed substrate includes a processing chamber, a first electrode provided in the processing chamber, a second electrode arranged in opposition to the first electrode, a main power source for supplying the first or second electrode with power for generating a plasma, a biasing power source for supplying the second or first electrode with biasing power, a gas supplying unit for supplying a processing gas into the processing chamber and a control unit for controlling the main power source, the biasing power source and the gas supplying unit, wherein the control unit performs a control such that, during a time of transition from a stationary state of plasma to a plasma quenching, an output of the main power source is kept not larger than an output of the biasing power source, a plasma processing being carried out in the stationary state of plasma.

According to another aspect of the present invention, a plasma processing apparatus for processing a surface of a to-be-processed substrate includes a processing chamber, a first electrode provided in the processing chamber, a second electrode arranged in opposition to the first electrode, a main power source for supplying the first or second electrode with power for generating a plasma, a biasing power source for supplying the second or first electrode with biasing power a gas supplying unit for supplying a processing gas into the processing chamber and a control unit for controlling the main power source, the biasing power source and the gas supplying unit, wherein the control unit performs a control such that, in a time of transition from a first state of plasma to a plasma quenching, a second state of plasma is created in which outputs of the main power source and the biasing power source are smaller than those in the first state of plasma, a plasma processing being carried out in the first state of plasma, and in the first state of plasma and during the time of transition including the second state of plasma, the output of the main power source is kept not larger than the output of the biasing power source.

As an example, the control unit serves to turn off, subsequent to the second state of plasma, powers of the main power source and the biasing power source to thereby quench a plasma.

As another example, the control unit serves to start to lower, in the second state of plasma, a pressure for the processing gas, serves to detect a quenching of the plasma by use of a luminosity monitor provided in the processing chamber and serves to turn off, after detection of the quenching of the plasma, the main power source and the biasing power source.

According to another aspect of the present invention, a plasma processing apparatus for processing a surface of a to-be-processed substrate includes a processing chamber, a first electrode provided in the processing chamber, a second electrode arranged in opposition to the first electrode, a main power source for supplying the first or second electrode with power for generating a plasma, a biasing power source for supplying the second or first electrode with biasing power, a gas supplying unit for supplying a processing gas into the processing chamber and a control unit for controlling the main power source, the biasing power source and the gas supplying unit, wherein the control unit performs a control such that, for a plasma ignition, a second state of plasma is created in which outputs of the main power source and the biasing power source are smaller than those in a stationary state of plasma, a plasma processing being carried out in said stationary state of plasma, the above-mentioned creation of the second state of plasma being effected under conditions such that an output of the main power source is not larger than that of the biasing power source, and the stationary state of plasma is created from the second state of plasma.

According to one or more of the above-mentioned aspects of the present invention, it is possible to control outputs of the main power source and the biasing power source so that a critical damage voltage is not exceeded, thereby suppressing occurrence of damages. By this, it is possible to accomplish a plasma processing with Vdc being always kept uniform from a time of a plasma ignition to a time of a plasma quenching, which will prevent application, to an insulating film of a semiconductor device to be subjected to a plasma processing, of such a high voltage that will cause a dielectric breakdown.

Accordingly, it is possible to effect a plasma processing free of damages to a semiconductor device, suppressing a decrease of the production yield of the semiconductor devices.

For the plasma quenching, a plasma is first brought into a pre-off plasma state and thereafter it is quenched in which the output of the biasing power source has been rendered small, maintaining a damage-free conditions. Consequently, the absolute value of Vdc becomes small, and, even when the plasma is quenched in a non-uniform manner, damages which may be caused will be small. Here, the "pre-off plasma" means a plasma which is generated, before a plasma quenching, with a small output of the main power source and a small output of the biasing power source.

In a similar manner, for a plasma ignition, a pre-on plasma (described later) is generated, and thereafter, it is transferred to a stationary state, whereby a damage voltage, which may be generated when a non-uniform plasma ignition takes place, can be made small.

Other objects, features and advantages of the invention will become apparent from the following description of the embodiments of the invention taken in conjunction with the accompanying drawings.

DESCRIPTION OF THE EMBODIMENTS

Embodiments of the present invention will now be described with reference to the accompanying drawings.

Embodiment 1

Figure 4:
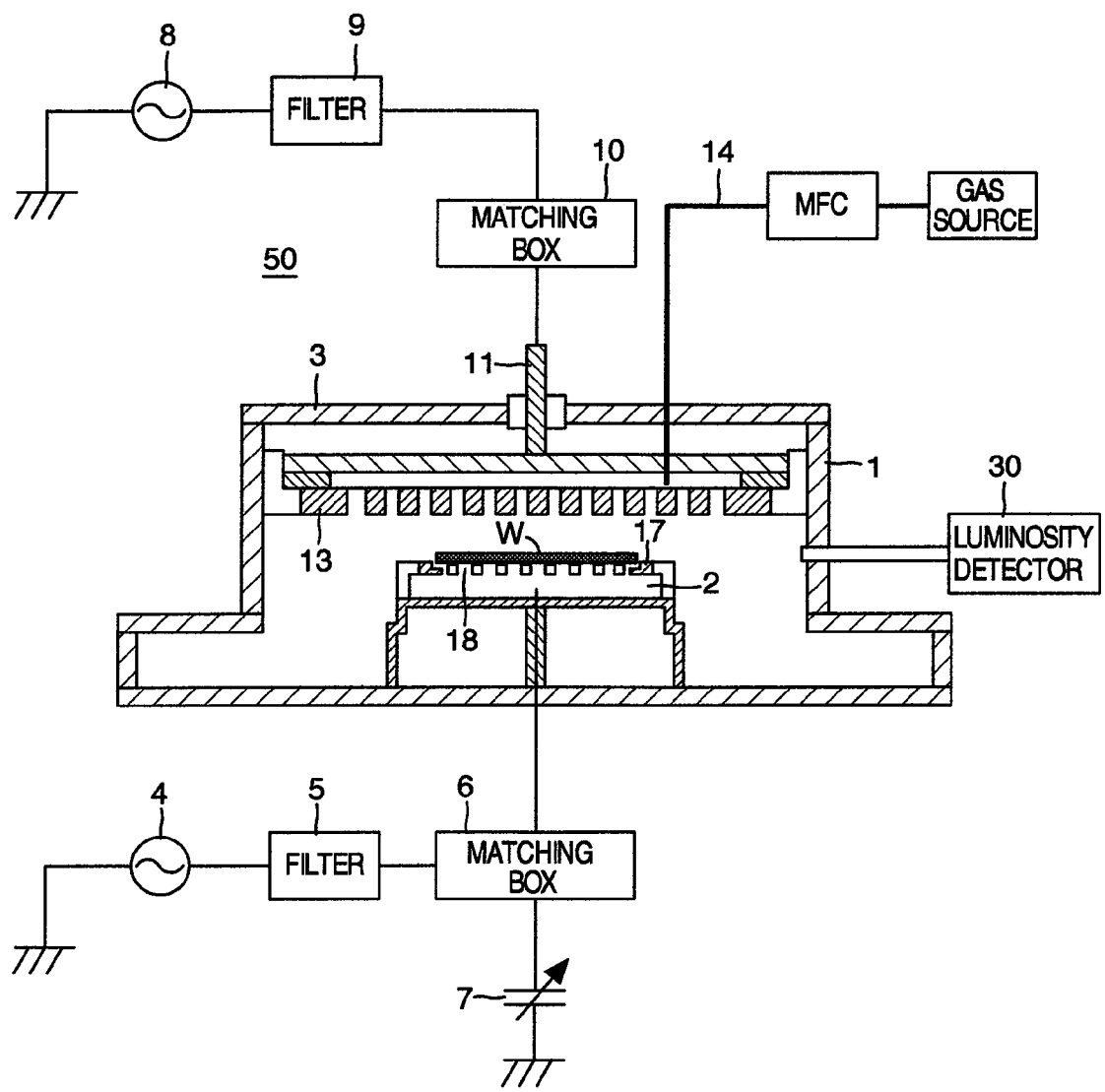
FIG. 4 is a schematic diagram of a plasma etching apparatus according to an embodiment of the present invention.

FIG. 4 shows a structure of a plasma etching apparatus 50 according to an embodiment of the present invention.

The plasma processing apparatus 1 includes a processing chamber 50 made of aluminum, SUS or the like, within which a lower electrode 2 and an upper electrode are provided. High frequency electric power is supplied to the lower electrode 2 through a filter 5 and a matching box 6 from a biasing power source 4. High frequency electric power is supplied to the upper electrode 3 through a filter 9 and a matching box 10 from a main power source 8. The lower electrode 2 also serves as a base on which to place a to-be-processed substrate W to be subjected to a plasma etching treatment.

The main power source 8 is a high frequency power source for generating a plasma and is operative at 200 MHz in this embodiment, but the frequency need not be restricted thereto. The biasing power source 4 is a high frequency power source for accelerating ions in the plasma and operates at a frequency lower than the main power source. The biasing power source 4 is operative at 4 MHz in this embodiment, but the frequency need not be restricted thereto, either.

The lower electrode 2 is further connected through the matching box 6 to a DC power source 7 and a sprayed film 18 of alumina or the like is formed on that part of the lower electrode which the to-be-processed substrate W overlies, so that an electrostatic chuck is formed between the to-be-processed substrate W and the lower electrode 2. The electrostatic chuck is supplied with a heat-conducting gas such as He from a heat-conducting supply tube not shown through a heat-conducting gas feed hole so that the gas infiltrates between the electrostatic chuck and the to-be-processed substrate W. By this, it is possible to raise the temperature of the lower electrode and to enhance the heat conduction efficiency of the to-be-processed substrate W. A heating medium controlled by a temperature control unit not shown so as to have a predetermined temperature is introduced into the lower electrode 2 and the upper electrode 3 so that the medium is circulated within the electrodes and is then ejected. Thereby, it is possible to control the temperatures of the lower electrode 2 and the upper electrode 3.

A focus ring 17 is provided around that part of the lower electrode which the to-be-processed substrate W overlies so that the substrate W is surrounded by the ring 17. The focus ring 17 is made of an electrically insulating material or an electrically conductive material and functions to concentrate reactive ions on the to-be-processed substrate. A gas for generating a plasma to be used for a plasma etching treatment is fed by a gas source to pass through a MFC which serves to adjust the flow rate and through a gas supply tube 14 to a shower plate 13 having a gas-spraying hole formed therein. The gas, having been dispersed at the shower plate 13, is introduced into the processing chamber 1. In this embodiment, the flow rates are 1,000 ml/min for Ar gas, 50 ml/min for $O_2$ gas and 50 ml/min for $C_4F_6$ gas.

The processing chamber 1 is pressurized by an evacuation mechanism not shown to hold the chamber 1 at a predetermined pressure. The chamber 1 is further provided with a luminosity monitor 30 to make it possible to confirm plasma ignition/quenching. In addition, although not shown, a control unit is provided for controlling the on/off timing for, the outputs of and others for the main power source 8, the biasing power source 4 and the DC power source 7, and for controlling the pressure (flow rate) of the gas to be supplied and the gas supply timing. Numeral 11 in the drawing represents an electric power supply tube.

In this embodiment, the main power source 8 and the biasing power source 4 are connected to the upper electrode 3 and the lower electrode 2, respectively. However, the connection is not limited thereto. The main power source 8 may be connected to the lower electrode 3, while the biasing power source may be connected to the upper electrode 3. Alternately, both the main power source and the biasing power source may be connected to one and the same electrode (the upper electrode or the lower electrode). Further, plural biasing power sources may be connected.

In this embodiment, the gap between the lower electrode 2 and the upper electrode 3 is 30 mm. However, the gap may be variable within a range from 10 mm to 40 mm depending on the processing conditions.

Figure 1:
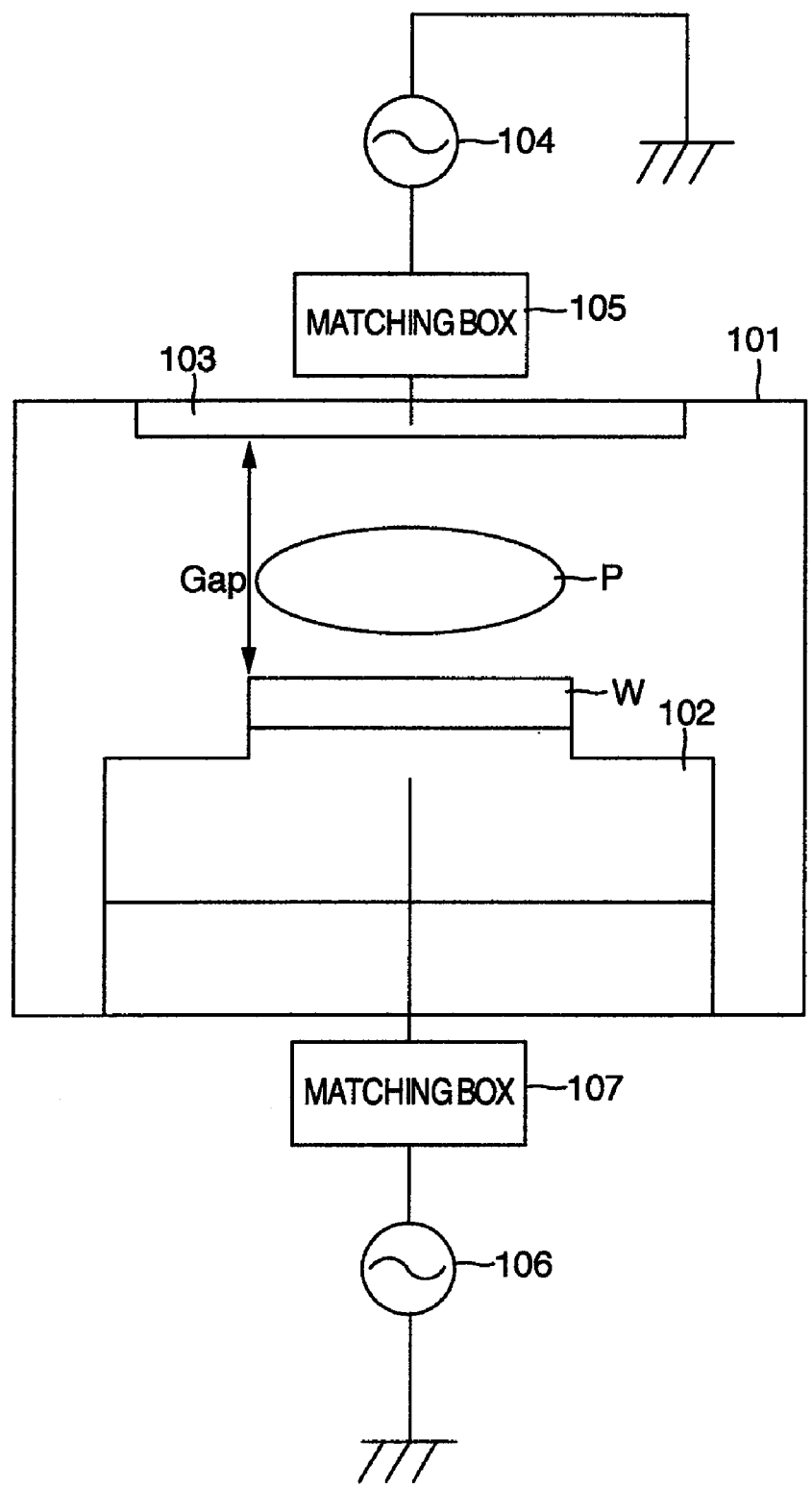
FIG. 1 is a schematic diagram of a plasma etching apparatus according to the related art.
Figure 2:
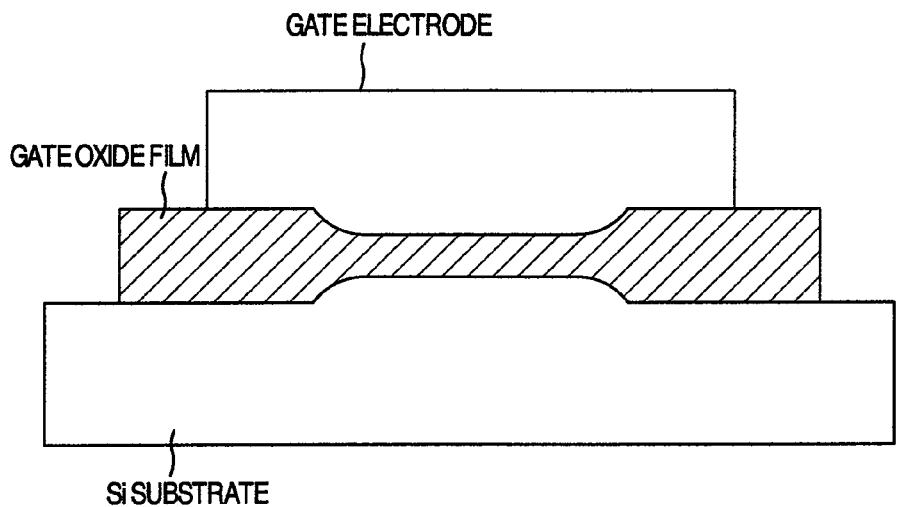
FIG. 2 is a schematic diagram of an antenna MOS capacitor type damage TEG.
Figure 3A:
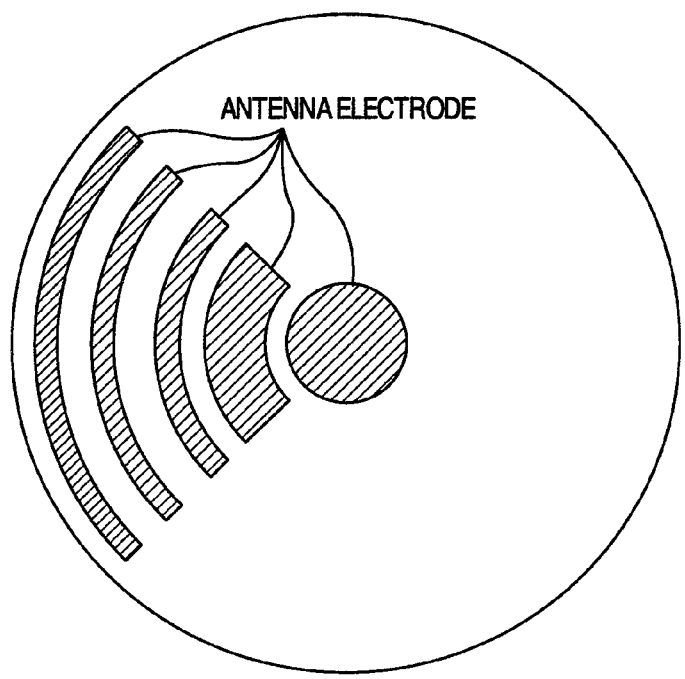
FIG. 3A is a plan view showing a general structure of a damage voltage measuring substrate.
Figure 3B:
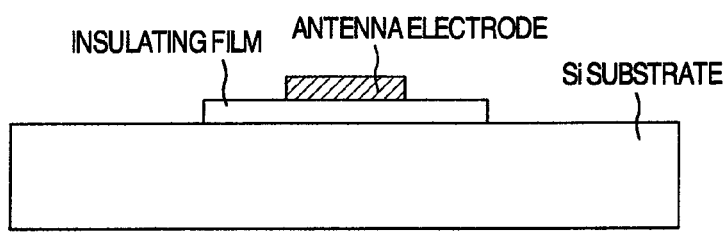
FIG. 3B is a side view showing a general structure of the damage voltage measuring substrate shown in FIG. 3A.

As described above, the present inventors have made experimental studies on the mechanism of generation of damages with the plasma etching apparatus 50 shown in FIG. 4 and the damage measuring substrate shown in FIGS. 3A and 3B.

Figure 5:
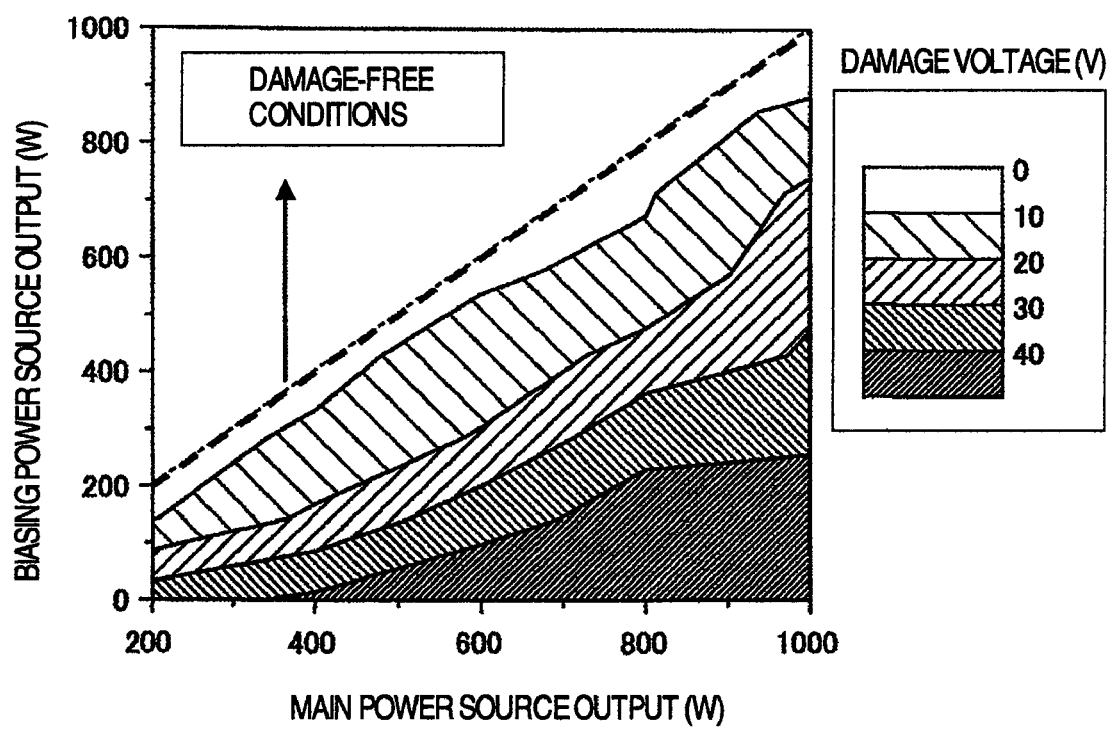
FIG. 5 is a diagram illustrating relations between outputs of a main power source and a biasing power source and damage voltages.

FIG. 5 illustrates relations between outputs of a main power source and a biasing power source and measured damage voltages.

Ranges of the outputs of the main power source and the biasing power source in which damage voltages generated are immaterial will be referred to as "damage-free conditions". With a damage voltage of 10 V, the white region in FIG. 5 should satisfy the damage-free conditions.

Consequently, it can be understood that a plasma processing under the conditions at least within the region above the dotted line in FIG. 5, namely, under the conditions in which a relation "main power source output≦biasing power source output" always stands will be free of damages.

In this embodiment, it is assumed that the damage voltage which causes undesirable damages is 10 V. This damage voltage depends on the thickness of the inter-layer insulation film shown in FIG. 3. It is well predictable that the thickness of the inter-layer insulation film in the coming semiconductor devices will be smaller and the damage voltage will be lower accordingly. However, it is needless to say that the above-described damage-free conditions are applicable to such coming semiconductor devices.

In the stationary state with a plasma having been ignited, with the outputs of the main power source and the biasing power source being properly set, the above-described damage-free conditions can be controlled by the control unit.

On the other hand, at a plasma quenching, the relation between the main power source and the biasing power source is liable to be broken. This is considered to be a cause of an increase of the damage voltages at the plasma quenching.

Figure 6A:
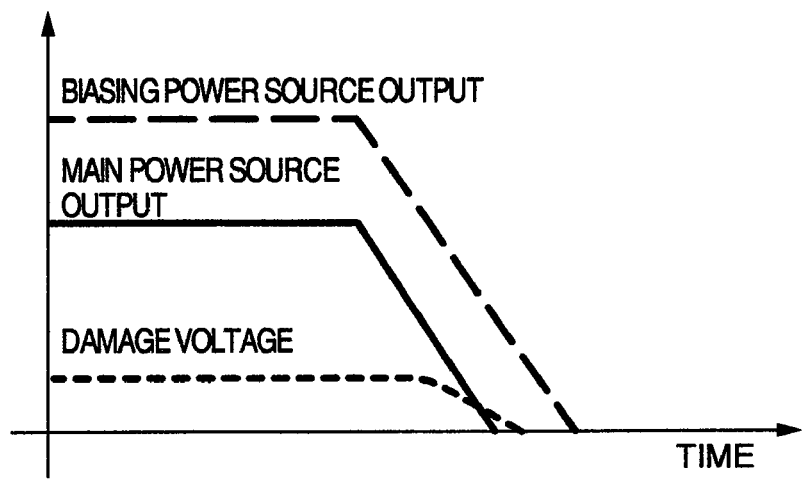
FIGS. 6A to 6C are diagrams each illustrating changes with time of outputs of a main power source and a biasing power source and of a damage voltage at a plasma quenching.
Figure 6B:
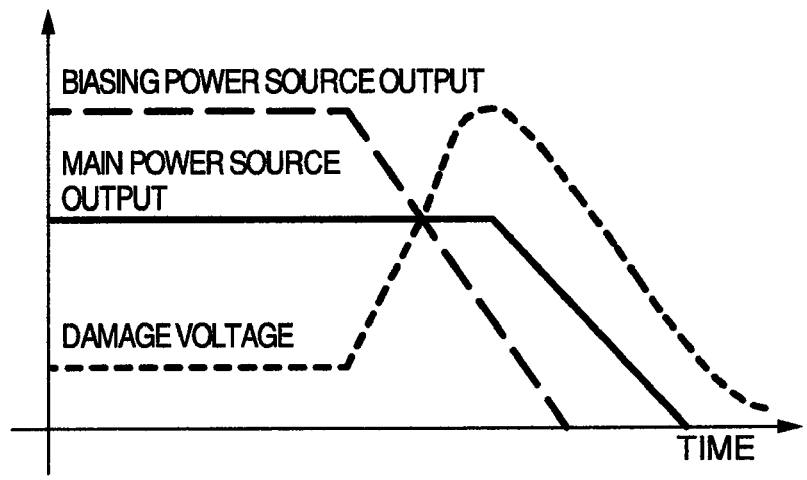
Figure 6C:
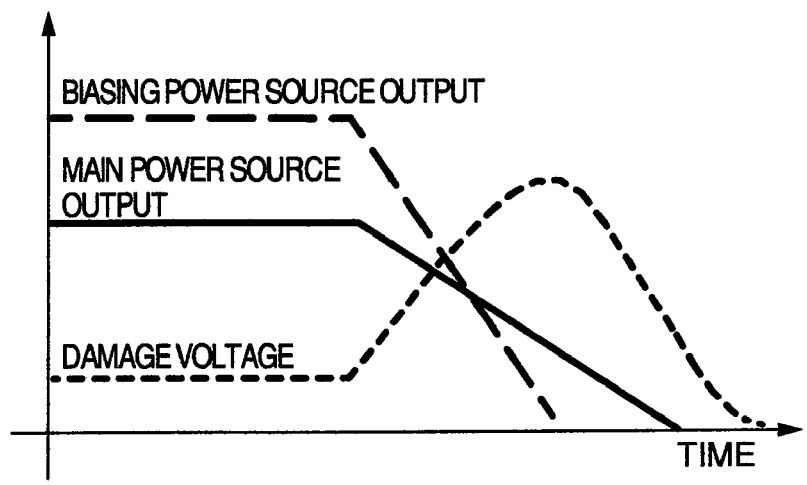

FIGS. 6A to 6C illustrate changes with time of outputs of a main power source and a biasing power source and of a damage voltage at a plasma quenching.

FIG. 6A illustrates how the damage voltage changes when the main power source and the biasing power source are simultaneously turned off in which the outputs of these sources fall at the same rate. As can be seen, the relation "main power source output≦biasing power source output" is held during the time from the turn-off of the power sources to the quenching of the plasma so that the damage voltage is never increased. Namely, no damage occurs.

However, it has been found that the timing for a fall of the output of the main power source is not always identical with that for a fall of the biasing power source.

FIG. 6B illustrates how the damage voltage changes when the main power source is turned off before the biasing power source. When the biasing power source first starts to fall, the relation "main power source output≦biasing power source output" is not maintained to increase the damage voltage, with a result that damages occur.

FIG. 6C illustrates how the damage voltage changes when the main power source and the biasing power source are simultaneously turned off but the rate of fall is different between the two power sources. The relation "main power source output≦biasing power source output" is not maintained in this case, either, and damages occur.

From the illustrations in FIGS. 6A to 6C, it is understood that there arise occasions in which the damage voltage, which is low in the stationary state, may be increased as the outputs of the main power source and the biasing power source fall.

Next, changes in distributions of the damage voltage have been observed with different biasing power source outputs with respect to a main power source output.

Figure 7:
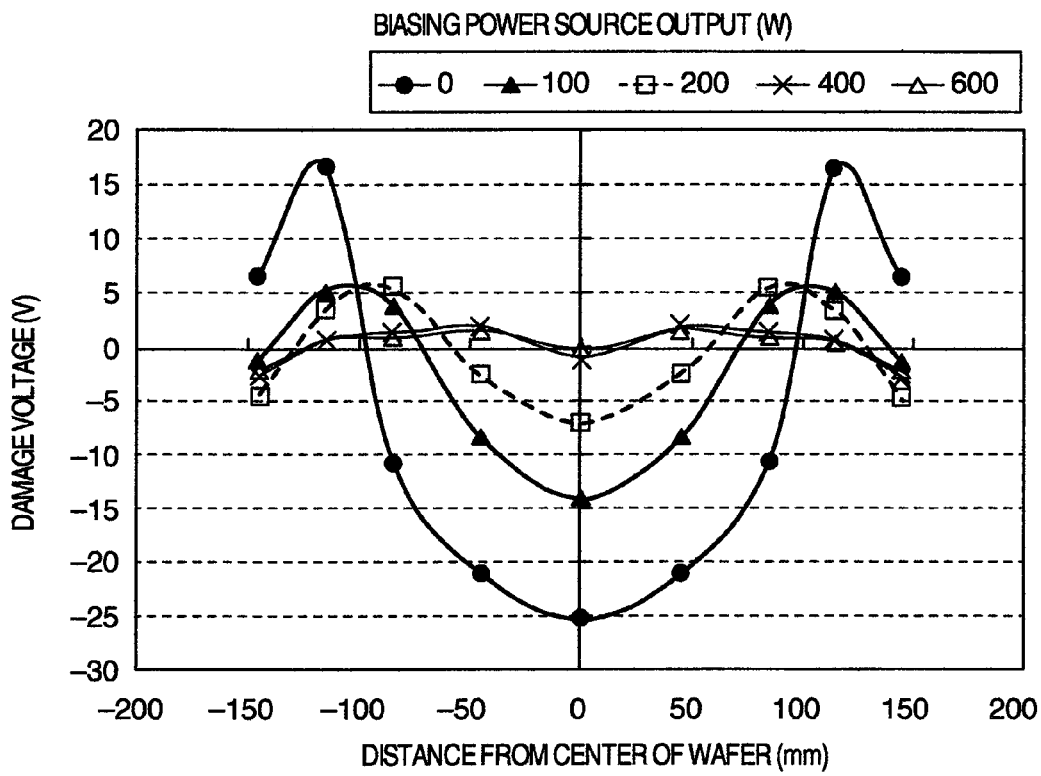
FIG. 7 is a diagram illustrating distributions of damage voltages with different outputs of a biasing power source.

FIG. 7 illustrates a distribution of damage voltages exhibited with a plasma generated only with the main power source having an output of 200 W and illustrates distributions of damage voltages exhibited with plasmas generated with the main power source output of 200 W and the biasing power source having different outputs.

When the biasing power source output is null, i.e., only the main power source is active, the plasma is not uniform. Meanwhile, when the biasing power source output is 100 W, the plasma distribution is still not uniform, although the degree of uniformity may be better than with only the main power source.

When the biasing power source output is 200 W, which satisfies the damage-free conditions for the main power source output of 200 W, the damage voltage is decreased to lower than 10 V. It is understood that as the biasing power source output is more increased, the distribution will have a higher degree of uniformity.

As a result of studies on the plasma distribution exhibited only with the main power source, it has been found that the damage voltage distribution is caused by a standing wave generated by the main power source output of 200 MHz.

Figure 8:
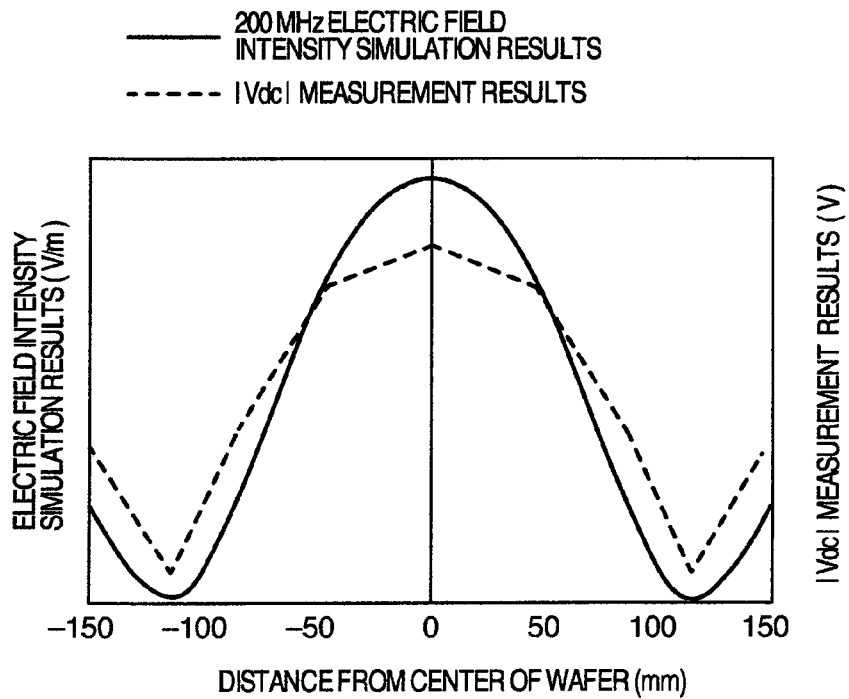
FIG. 8 is a diagram showing results of measurements of |Vdc| and results of simulation of electric field intensities.

FIG. 8 shows results of computer simulation of a distribution of electric field intensities at 200 MHz in the presence of a plasma. The distribution of damage voltages and that of the 200 MHz electric field intensities are coincident with each other, from which it is considered that the distribution of the electric field intensities by the main power source of 200 MHz exerts influences on the damage voltages. Namely, a plasma generated only with the main power source entails Vdc owing to the 200 MHz power. Since the distribution of the plasma depends on the electric field intensity, the distribution of plasma is non-uniform like the distribution of the standing wave of 200 MHz. The distribution of Vdc depends on the plasma distribution, so that Vdc is non-uniform, resulting in high damage voltage.

When a biasing power source is used in addition to the main power source, there coexist Vdc generated by the electromagnetic wave of 4 MHz from the biasing power source and Vdc generated by the electromagnetic wave of 200 MHz from the main power source. Since the electric field intensity distribution by the electromagnetic wave of 4 MHz is negligible within the chamber, Vdc by the electromagnetic wave of 4 MHz may be regarded as having no distribution. Therefore, in order to prevent occurrence of damage voltages, i.e., in order to make the distribution of Vdc small, the Vdc generated by the biasing power source of 4 MHz should be rendered predominant.

As described above, in the transitional course from a stationary state of plasma, in which a plasma processing is to be carried out, to a plasma quenching, at least by satisfying the conditions such that relation "main power source output≦biasing power source output" stands, it is possible to satisfactorily accomplish a plasma processing suffering reduced damages.

When plural biasing power sources are connected, a sum of the outputs of all of those biasing power sources should be applied to the above relation.

The control unit may be arranged so as to automatically control the outputs of the main and biasing power sources so that relation "main power source output≦biasing power source output" stands, or may be arranged to give a warning to an operator handling the processing apparatus in case the above relation does not stand due to some failures.

Embodiment 2

A second embodiment of the present invention will be described with reference to FIGS. 9 and 10.

In this embodiment, the absolute value of Vdc is decreased to a smallest possible value, and thereafter, a plasma is quenched.

Figure 9:
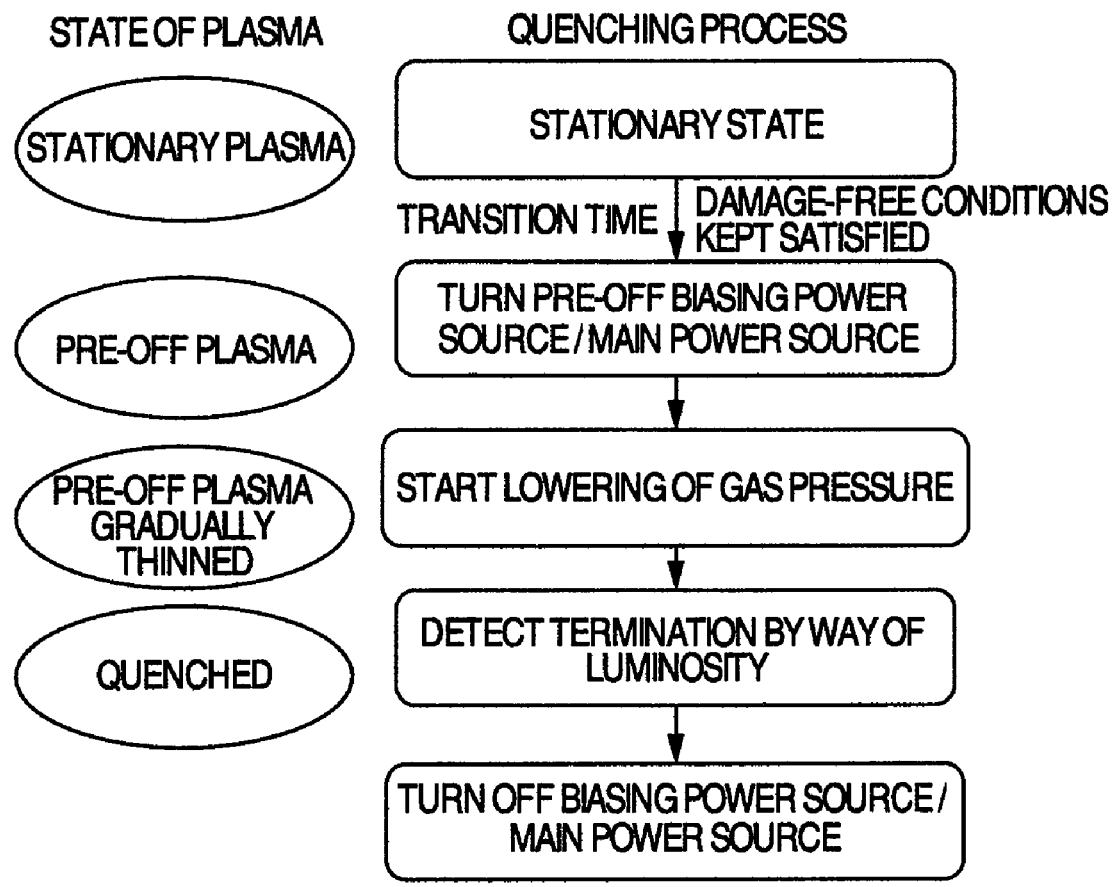
FIG. 9 is a flow chart according to a second embodiment of the present invention.
Figure 10:
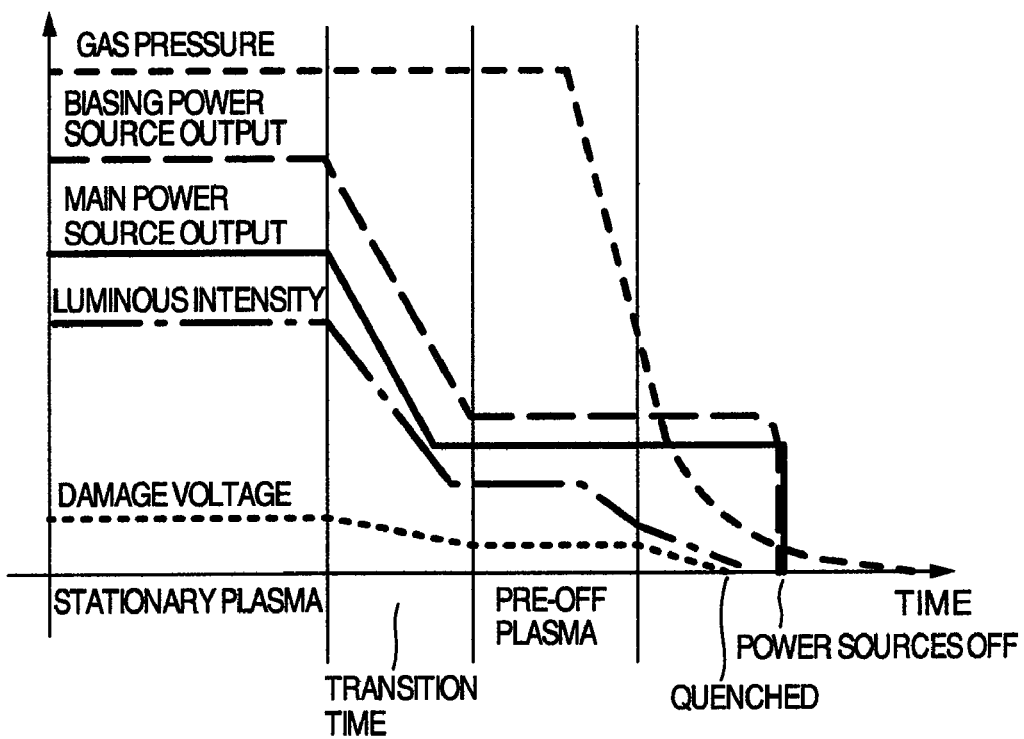
FIG. 10 is a timing chart according to the second embodiment of the present invention.

FIG. 9 is a flow chart and FIG. 10 is a timing chart, each showing a second embodiment.

Reference will be made to FIG. 10 to describe how a damage voltage changes at various stages.

In the stationary state of plasma, since the relation "main power source output≦biasing power source output" is held, the plasma is uniform and no damage takes place.

For a plasma quenching, the output of the main power source is, for example, gradually decreased from 800 W to 200 W, while the output of the biasing power source is, for example, gradually decreased from 1000 W to 400 W, with the relation "main power source output≦biasing power source output" being maintained, thereby creating a pre-off state of plasma. Alternately, the output of the main power source may first be decreased with the output of the biasing power source being decreased thereafter.

In the pre-off state of plasma, the output of the main power source assumes a smallest possible value that will keep the plasma un-quenched so that the plasma has a low density. Meanwhile, the output of the biasing power source is decreased to such a small value that will well keep the relation "main power source output≦biasing power source output" so that the absolute value of Vdc is small. Accordingly, even with the plasma quenched in a non-uniform manner, a resulting damage voltage can be made low.

Further, since the relation "main power source output≦biasing power source output" is never discontinued during the transition so far, the distribution of Vdc is uniform. As a result, the damage voltage can be kept low.

After the pre-off state of plasma has been fixed, the gas pressure is gradually decreased to quench the plasma. The quenching of the plasma is detected by the luminosity monitor. After the plasma quenching is detected, the outputs of the main power source and the biasing power source are decreased to null.

It should be noted that a predetermined time period is particularly provided for the pre-off state of plasma, because possible non-uniformity of the performances of the main power source and the biasing power source is taken into consideration.

In the above, the plasma is quenched with the gas pressure lowered. However, since the pre-off state plasma entails Vdc having a small absolute value, and therefore, charge-up damages are not liable to occur, various measures other than the above-mentioned one may be take to quench the plasma.

For example, with the pre-off state of plasma having been fixed, the main power source and the biasing power source may be turned off to quench the plasma. In this case, too, it is necessary to keep the outputs of the main power source and the biasing power source satisfying the damage-free conditions until the outputs of the power sources have been decreased to null.

As described above, in the transitional course from a stationary state of plasma, in which a plasma processing is to be carried out, to a plasma quenching, at least by satisfying the conditions such that relation "main power source output≦biasing power source output" stands, and by generating a pre-off plasma in the transitional course, it is possible to accomplish a plasma processing suffering suppressed damages even when the plasma is quenched in a non-uniform manner.

The control unit may be arranged so as to automatically control the outputs of the main and biasing power sources so that the relation "main power source output≦biasing power source output" stands, or may be arranged to give a warning to an operator handling the processing apparatus in case the above relation does not stand due to some failures.

Embodiment 3

A third embodiment of the present invention will next be described with reference to FIGS. 11 and 12.

In this embodiment, a plasma ignition free of damages will be described.

Figure 11:
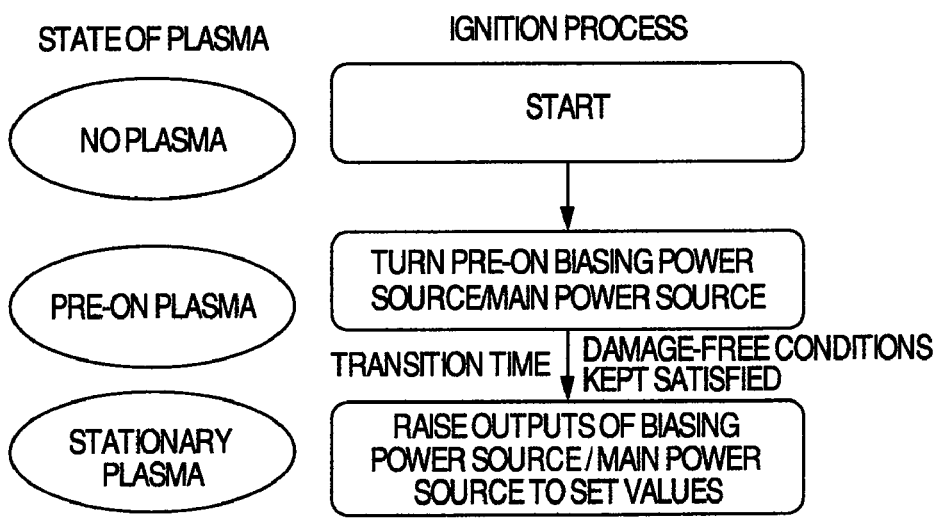
FIG. 11 is a flow chart according to a third embodiment of the present invention.
Figure 12:
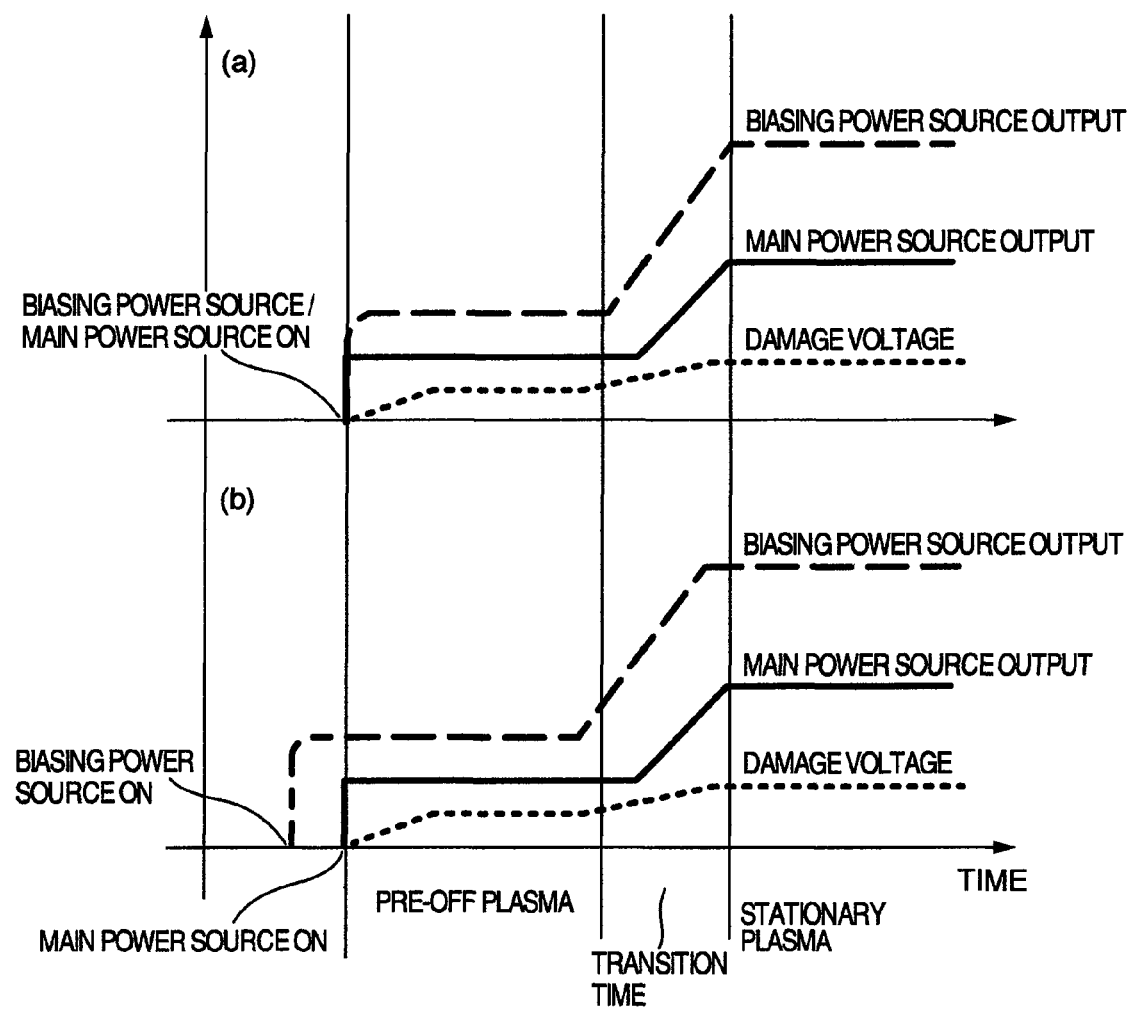
FIG. 12 is a timing chart according to the third embodiment of the present invention.

FIG. 11 is a flow chart and FIG. 12 is a timing chart, each showing a third embodiment.

Basically, the same is applicable to the plasma ignition as the plasma quenching as described above. Namely, the main power source and the biasing power source should be in the relation "main power source output≦biasing power source output".

First, the main power source is operated to provide a small power within a range in which a plasma is allowed to be generated. As for the biasing power source, it is operated to start to provide a power simultaneously with the main power source as shown at (a) of FIG. 12, or otherwise, before the main power source as shown at (b) of FIG. 12. In either case, the outputs of these power sources are kept at a smallest possible values with the relation "main power source output≦biasing power source output" being maintained. The plasma in this state is called "a pre-on plasma".

The pre-on plasma has properties similar to those of the pre-off plasma. In other words, since the output of the biasing power source assumes a small value within a range in which the damage-free conditions are satisfied, the absolute value of Vdc is small so that, even when a plasma is ignited in a non-uniform manner, damage voltages to be generated will be low.

As described above, when a plasma is to be ignited, a pre-on plasma is first generated on the way to the plasma ignition, in which at least the conditions are satisfied such that the relation "main power source output≦biasing power source output" stands. Thereafter, a stationary plasma is generated from the pre-on plasma. Thus, it is possible to satisfactorily accomplish a plasma processing suffering reduced damages.

The control unit may be arranged so as to automatically control the outputs of the main and biasing power sources so that the relation "main power source output≦biasing power source output" stands, or may be arranged to give a warning to an operator handling the processing apparatus in case the above relation does not stand due to some failures.

According to the described embodiments of the present invention, it is possible to suppress the charge-up damages to devices during the process of manufacturing semiconductor circuit devices in which a plasma processing is involved. Consequently, a decrease of the production yield of semiconductor circuit devices can be avoided.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus for processing a surface of a substrate, which is located in a processing chamber, by using a plasma which is generated inside the processing chamber, comprising:
   the processing chamber:
   a first electrode which is provided in said processing chamber and on which the substrate is located;
   a second electrode arranged above and in opposition to said first electrode at an upper portion of the processing chamber;
   a main power source for supplying said second electrode with power for generating the plasma;
   a biasing power source for supplying said first electrode with biasing power;
   a gas supplying unit for supplying a processing gas into said processing chamber; and
   a control unit is provided to control said main power source, said biasing power source and said gas supplying unit, wherein
   said control unit is configured to perform a control such that, during a time of transition to a plasma quenching from a stationary state of plasma in which the processing of the substrate is carried out in a state that an output of the main power source is set to be equal to or smaller than an output of the biasing power source, the output of said main power source and the output of said biasing power source are reduced while the output of said main power source is kept to be equal to or smaller than the output of said biasing power source and thereafter the plasma is quenched.

2. A plasma processing apparatus for processing a surface of a substrate, which is located in a processing chamber, by using a plasma which is generated inside the processing chamber, comprising:
- the processing chamber;
- a first electrode which is provided in said processing chamber and on which the substrate is located;
- a second electrode arranged above and in opposition to said first electrode at an upper portion of the processing chamber;
- a main power source for supplying said second electrode with power for generating the plasma;
- a biasing power source for supplying said first electrode with biasing power;
- a gas supplying unit for supplying a processing gas into said processing chamber; and
- a control unit is provided to control said main power source, said biasing power source and said gas supplying unit, wherein
- said control unit is configured to perform a control such, during a time of transition from a stationary state of plasma to a plasma quenching, in a transition from a first state in which an output of the main power source is set to be equal to or smaller than an output of the biasing power source so as to carry out a processing of the substrate to a second state of plasma is created in which the outputs of said main power source and said biasing power source are respectively smaller than those in said first state of plasma, each of the outputs of the main power source and the biasing power source is reduced while the output of said main power source is kept to be equal to or smaller than the output of said biasing power source and thereafter the plasma is quenched.

3. A plasma processing apparatus according to claim 2, wherein said control unit serves to turn off, subsequent to said second state of plasma, powers of said main power source and said biasing power source to thereby quench a plasma.

4. A plasma processing apparatus according to claim 2, wherein said control unit:
- serves to start to lower, in said second state of plasma, a pressure for said processing gas,
- serves to detect a quenching of a plasma by use of a luminosity monitor provided in said processing chamber, and
- serves to turn off, after detection of the quenching of the plasma, said main power source and said biasing power source.

5. A plasma processing apparatus for processing a surface of a to-be-processed substrate comprising:
- a processing chamber;
- a first electrode provided in said processing chamber;
- a second electrode arranged in opposition to said first electrode;
- a main power source for supplying said first electrode or said second electrode with power for generating a plasma;
- a biasing power source for supplying said second electrode or said first electrode with biasing power;
- a gas supplying unit for supplying a processing gas into said processing chamber; and
- a control unit is provided to control said main power source, said biasing power source and said gas supplying unit, wherein
- said control unit is configured to perform a control such that:
- for a plasma ignition, a second state of plasma is created in which outputs of the main power source and the biasing power source are smaller than those in a stationary state of plasma, a plasma processing being carried out in said stationary state of plasma,
- said creation of the second state of plasma being effected under conditions such that an output of said main power source is not larger than that of said biasing power source, and
- said stationary state of plasma is created from said second state of plasma.

* * * * *